(12) United States Patent
Chen et al.

(10) Patent No.: US 12,328,893 B2
(45) Date of Patent: Jun. 10, 2025

(54) SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Fu Chen, Suzhou (CN); Ronghui Hao, Suzhou (CN); King Yuen Wong, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 960 days.

(21) Appl. No.: 17/433,615

(22) PCT Filed: Aug. 2, 2021

(86) PCT No.: PCT/CN2021/110129
§ 371 (c)(1),
(2) Date: Aug. 25, 2021

(87) PCT Pub. No.: WO2023/010252
PCT Pub. Date: Feb. 9, 2023

(65) Prior Publication Data
US 2023/0031437 A1    Feb. 2, 2023

(51) Int. Cl.
*H10D 30/47* (2025.01)
*H10D 30/01* (2025.01)
(Continued)

(52) U.S. Cl.
CPC ......... *H10D 30/475* (2025.01); *H10D 30/015* (2025.01); *H10D 62/824* (2025.01); *H10D 62/8503* (2025.01)

(58) Field of Classification Search
None
See application file for complete search history.

(56) References Cited

U.S. PATENT DOCUMENTS 10,680,092 B2 * 6/2020 Moens ................. H10D 62/221
10,770,575 B2 * 9/2020 Dasgupta ............ H10D 62/117
(Continued)

FOREIGN PATENT DOCUMENTS

CN         103296079 A     9/2013
CN         106876443 A     6/2017
CN         109314135 A     2/2019

OTHER PUBLICATIONS

International Search Report and Written Opinion of the corresponding PCT application No. PCT/CN2021/110129 mailed on Apr. 15, 2022.
(Continued)

*Primary Examiner* — Nishath Yasmeen
(74) *Attorney, Agent, or Firm* — JCIPRNET

(57) ABSTRACT

A semiconductor device includes a first and a second nitride-based semiconductor layers, a source electrode, a drain electrode, a gate electrode, and a first and a second stress modulation layers. The first nitride-based semiconductor layer has a first thickness. The second nitride-based semiconductor layer has a bandgap less than a bandgap of the first nitride-based semiconductor layer to form a heterojunction therebetween. The second nitride-based semiconductor layer has a second thickness, and a ratio of the first thickness to the second thickness is in a range from 0.5 to 5. The first and the second stress modulation layers provide a first and a second drift regions of the second nitride-based semiconductor layer with stress, respectively, resulting in induction of a first and a second 2DHG regions within the first and the second drift regions, respectively.

15 Claims, 8 Drawing Sheets

(51) Int. Cl.
*H10D 62/824* (2025.01)
*H10D 62/85* (2025.01)

(56) References Cited

U.S. PATENT DOCUMENTS

| | | | |
|---|---|---|---|
| 2004/0061129 A1 | 4/2004 | Saxler et al. | |
| 2010/0327322 A1* | 12/2010 | Kub | H10D 30/475 257/E21.403 |
| 2014/0264379 A1* | 9/2014 | Kub | H01L 21/762 257/77 |
| 2018/0138305 A1* | 5/2018 | Deng | H10D 30/015 |

OTHER PUBLICATIONS

Herwig Hahn et al., "p-Channel Enhancement and Depletion Mode GaN-Based HFETs With Quaternary Backbarriers", IEEE Transactions on Electron Devices, vol. 60, No. 10, Oct. 2013, p. 3005-3011.
Ashwani Kumar et al., "Impact of channel thickness on the performance of an E-mode p-channel MOSHFET in GaN", Applied Physics Letters, vol. 112, 2018, 153503.
Fu Chen et al., "Enhancement-mode n-GaN gate p-channel heterostructure field effect transistors based on GaN/AlGaN 2D hole gas", Applied Physics Letters, vol. 115, 2019, 112103.

* cited by examiner

SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a p-channel enhancement mode semiconductor device with stress modulation layers for inducing two-dimensional hole gas (2DHG) regions.

BACKGROUND

In recent years, intense research on high-hole-mobility transistors (HHMTs) has been prevalent, particularly for high power switching and high frequency applications. III-nitride-based HHMTs utilize a heterojunction interface between two materials with different bandgaps to form a quantum well-like structure, which accommodates a two-dimensional hole gas (2DHG) region, satisfying demands of high power/frequency devices. With respect to practical demands, the HHMTs need to be designed to be normally-off. However, due to process factors, the development of the normally-off HHMTs encounters manufacturing challenges. At present, there is a need to improve the yield rate for the normally-off HHMTs, thereby making them suitable for mass production.

SUMMARY OF THE DISCLOSURE

In accordance with one aspect of the present disclosure, a semiconductor device is provided. A semiconductor device includes a first nitride-based semiconductor layer, a second nitride-based semiconductor layer, a source electrode, a drain electrode, a gate electrode, a first stress modulation layer and a second stress modulation layer. The first nitride-based semiconductor layer has a first thickness. The second nitride-based semiconductor layer is disposed on the first nitride-based semiconductor layer and has a bandgap less than a bandgap of the first nitride-based semiconductor layer to form a heterojunction therebetween. The second nitride-based semiconductor layer has a second thickness, and a ratio of the first thickness to the second thickness is in a range from 0.5 to 5. The source electrode and the drain electrode are disposed over a source portion and a drain portion of the second nitride-based semiconductor layer, respectively. The gate electrode is disposed over a gate portion of the second nitride-based semiconductor layer and between the source and drain electrodes, so as to define a first drift region between the source and gate portions and a second drift region between the gate and drain portions. The first stress modulation layer is disposed on the second nitride-based semiconductor layer and between the source and gate electrodes and provides the first drift region with a stress, resulting in induction of a first two-dimensional hole gas (2DHG) region within the first drift region. The second stress modulation layer is disposed on the second nitride-based semiconductor layer and between the gate and drain electrodes and provides the second drift region with a stress, resulting in induction of a second 2DHG region within the second drift region. The ratio of the first thickness to the second thickness is selected such that hole concentrations of the first and second 2DHG regions are greater than those of the heterojunction beneath the source, gate, drain portions of the second nitride-based semiconductor layer.

In accordance with one aspect of the present disclosure, a semiconductor device is provided. A semiconductor device includes a first nitride-based semiconductor layer, a second nitride-based semiconductor layer, a source electrode, a drain electrode, a gate electrode, a stress modulation layer and a second stress modulation layer. The second nitride-based semiconductor layer is disposed on the first nitride-based semiconductor layer and has a bandgap less than a bandgap of the first nitride-based semiconductor layer to form a heterojunction therebetween. The source electrode and the drain electrode are disposed the second nitride-based semiconductor layer. The gate electrode is disposed over and in contact with the second nitride-based semiconductor layer to form an interface with the second nitride-based semiconductor layer. The first stress modulation layer and the second stress modulation layer are disposed on the second nitride-based semiconductor layer and provide the second nitride-based semiconductor layer with at least one stress, resulting in induction of a first two-dimensional hole gas (2DHG) region and a second 2DHG region, which are separated from each other by a portion of the heterojunction beneath the gate electrode as a voltage applied to the gate electrode is less than a threshold voltage of the gate electrode.

In accordance with one aspect of the present disclosure, a method for manufacturing a semiconductor device is provided. The method includes steps as follows. A first nitride-based semiconductor layer is formed. A second nitride-based semiconductor layer is formed on the first nitride-based semiconductor layer to form a heterojunction therebetween. The second nitride-based semiconductor layer is thin enough such that holes at heterojunction are forbidden to be free to move parallel to the heterojunction. A gate electrode, a source electrode, and a drain electrode are formed above the second nitride-based semiconductor layer. A first stress modulation layer is formed on the second nitride-based semiconductor layer and between the source and gate electrodes so as to provide a first drift region between the source and gate electrodes with a stress, resulting in induction of a first two-dimensional hole gas (2DHG) region within the first drift region. A second stress modulation layer is formed on the second nitride-based semiconductor layer and between the gate and drain electrodes so as to provide a second drift region between the gate and drain electrodes with a stress, resulting in induction of a second 2DHG region within the second drift region.

By the above configuration, the thickness ratio of the first and the second nitride-based semiconductor layers is intentionally controlled in a range from 0.5 to 5, and thus the 2DHG regions is hard to be inherently induced/generated in the second nitride-based semiconductor layer. The first and second stress modulation layers can provide stresses to separated regions of the second nitride-based semiconductor layer, so as to induce separated first and second 2DHG regions therein. Since a region of the second nitride-based semiconductor layer between the first and second 2DHG regions is free from coverage of the stress modulation layers, no 2DHG region is induced at there. The first and second 2DHG regions are naturally interrupted due to the absence of 2DHG region therebetween. Hence, the p-channel enhancement mode semiconductor device can be realized. The manufacturing process of the semiconductor device is simple and avoids using additional etching step to etch the nitride-based semiconductor layer for interfering with the continuity of the 2DHG region. Thus, the semiconductor device of the present disclosure can have a good reliability, good electrical properties and a good yield rate.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Figure 1:
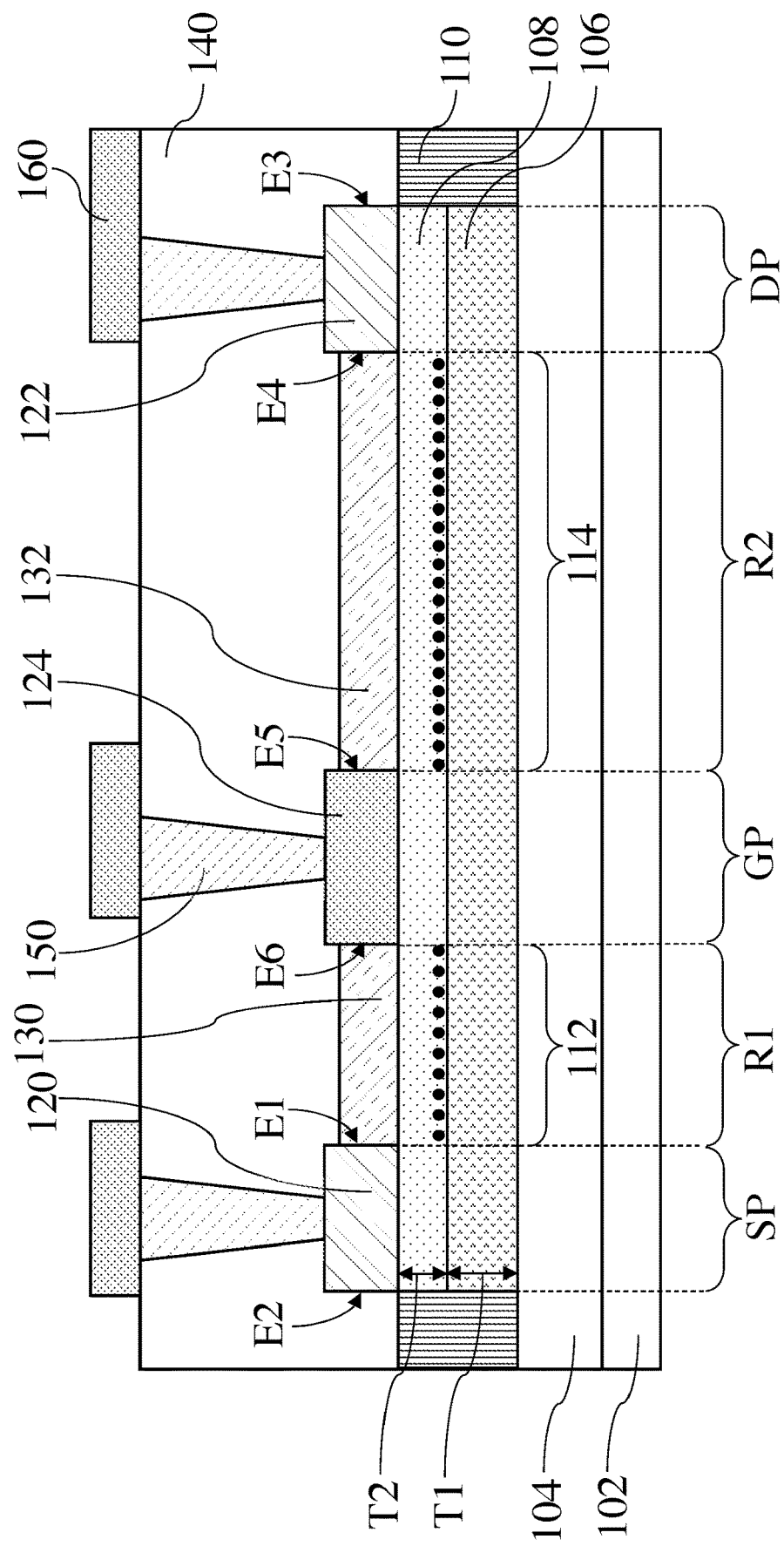
FIG. 1 is a vertical cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1 is a vertical cross-sectional of a semiconductor device 100A according to some embodiments of the present disclosure. The semiconductor device 100A includes a substrate 102, a buffer layer 104, nitride-based semiconductor layers 106 and 108, isolation structures 110, a source electrode 120, a drain electrode 122, a gate electrode 124, stress modulation layers 130 and 132, a passivation layer 140, contact vias 150, and a patterned conductive layer 160.

The substrate 102 may be a semiconductor substrate. The exemplary materials of the substrate 102 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 102 can include, for example, but is not limited to, group III elements, group IV elements, group V elements, or combinations thereof (e.g., III-V compounds). In other embodiments, the substrate 102 can include, for example but is not limited to, one or more other features, such as a doped region, a buried layer, an epitaxial (epi) layer, or combinations thereof.

The buffer layer 104 can be disposed on/over/above the substrate 102. The buffer layer 104 can be disposed between the substrate 102 and the nitride-based semiconductor layer 106. The buffer layer 104 can be configured to reduce lattice and thermal mismatches between the substrate 102 and the nitride-based semiconductor layer 106, thereby curing defects due to the mismatches/difference. The buffer layer 104 may include a III-V compound. The III-V compound can include, for example but are not limited to, aluminum, gallium, indium, nitrogen, or combinations thereof. Accordingly, the exemplary materials of the buffer layer 104 can further include, for example but are not limited to, GaN, AlN, AlGaN, InAlGaN, or combinations thereof. In some embodiments, the semiconductor device 100A may further include a nucleation layer (not shown). The nucleation layer may be formed between the substrate 102 and the buffer layer 104. The nucleation layer can be configured to provide a transition to accommodate a mismatch/difference between the substrate 102 and a III-nitride layer of the buffer layer. The exemplary material of the nucleation layer can include, for example but is not limited to AlN or any of its alloys.

The nitride-based semiconductor layer 106 is disposed on/over/above the buffer layer 104. The nitride-based semiconductor layer 108 is disposed on/over/above the nitride-based semiconductor layer 104. The exemplary materials of the doped nitride-based semiconductor layer 106 can include, for example but are not limited to, nitrides or group III-V compounds, such as GaN, AlN, InN, $In_xAl_yGa_{(1-x-y)}N$ where x+y≤1, $Al_aGa_{(1-a)}N$ where a≤1. The exemplary materials of the nitride-based semiconductor layer 108 can include, for example but are not limited to, p-doped group III-V nitride semiconductor materials, such as p-type GaN, p-type AlGaN, p-type InN, p-type AlInN, p-type InGaN, p-type AlInGaN, or combinations thereof.

The exemplary materials of the nitride-based semiconductor layers 106 and 108 are selected such that the nitride-based semiconductor layer 108 has a bandgap (i.e., forbidden band width) less than a bandgap of the nitride-based semiconductor layer 106, which causes electron affinities thereof different from each other and forms a heterojunction therebetween. For example, when the nitride-based semiconductor layer 106 is an AlGaN layer having bandgap of approximately 4.0 eV, the nitride-based semiconductor layer 108 can be selected as a p-type doped GaN layer having a bandgap of approximately 3.4 eV.

The source electrode 120 and the drain electrode 122 are disposed on/above/over the nitride-based semiconductor layer 108. The source electrode 120 and the drain electrode 122 are in contact with different portions of the nitride-based semiconductor layer 108, respectively. Specifically, the source electrode 120 is disposed on/above/over a source portion SP of the nitride-based semiconductor layer 108. The source electrode 120 is in contact with the source portion SP. The drain electrode 122 is disposed on/above/over a drain portion DP of the nitride-based semiconductor layer 108. The drain electrode 122 is in contact with the drain portion DP.

In some embodiments, the source electrode 120 and the drain electrode 122 can include, for example but are not limited to, metals, alloys, doped semiconductor materials (such as doped crystalline silicon), compounds such as silicides and nitrides, other conductor materials, or combinations thereof. The exemplary materials of the source electrode 120 and the drain electrode 122 can include, for example but are not limited to, Ti, AlSi, TiN, or combinations thereof. Each of the source electrode 120 and the drain electrode 122 may be a single layer, or plural layers of the same or different composition. In some embodiments, the source electrode 120 and the drain electrode 122 form ohmic contacts with the nitride-based semiconductor layer 108; therefore, the source electrode 120 and the drain electrode 122 can be served as the contact electrodes. The ohmic contacts can be achieved by applying Ti, Al, or other suitable materials to the source electrode 120 and the drain electrode 122. In some embodiments, each of the source electrode 120 and the drain electrode 122 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The gate electrode 124 is disposed on/above/over the nitride-based semiconductor layer 108. The gate electrode 124 is in contact with the nitride-based semiconductor layer 108. Specifically, the gate electrode 124 is disposed on/above/over a gate portion GP of the nitride-based semiconductor layer 108, so as to define a drift region R1 between the source and gate portions SP and GP and a drift region R2 between the gate and drain portions GP and DP. The gate electrode 124 is in contact with the gate portion GP. The gate electrode 124 forms an interface with the gate portion GP of the nitride-based semiconductor layer 108.

The exemplary materials of the gate electrode 124 may include metals or metal compounds. The gate electrode 124 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds.

The source electrode 120, the drain electrode 122, and the gate electrode 124 can constitute parts of a transistor in the semiconductor device 100A. In some embodiments, these elements can constitute parts of a p-channel transistor.

As considered a p-channel semiconductor device having a GaN channel layer with a bandgap of approximately 3.4 eV and a AlGaN barrier layer with a bandgap of approximately 4.0 eV, a triangular well potential is generated at a bonded interface between the channel and barrier layers due to polarization effect thereof, so that holes accumulate in the triangular well, thereby generating a two-dimensional hole gas (2DHG) region adjacent to the heterojunction. It should be noted that the formation of the 2DHG region is positively related to the extent of the polarization effect between the channel and barrier layers. Typically, the p-channel semiconductor device is normally-on because of the automatic formation of the continuous 2DHG region.

In the present disclosure, the thicknesses of the nitride-based semiconductor layers 106 and 108 are selected as well, such that a 2DHG region can work once an external factor is introduced. In other words, without any external factor, holes concentrations of the heterojunction between the nitride-based semiconductor layers 106 and 108 would be zero of approach to zero so no 2DHG region is generated.

More specifically, the nitride-based semiconductor layer 106 has a thickness T1, and the nitride-based semiconductor layer 108 has a thickness T2. The formation of the 2DHG regions result from polarization effect of the nitride-based semiconductor layers 106 and 108, so the thickness ratio of the nitride-based semiconductor layers 106 and 108 determines the extent of polarization effect therein. In some embodiments, a ratio of the thickness T1 to the thickness T2 is intentionally controlled/selected in a range from about 0.5 to about 5, such that there is no apparent polarization effect in the nitride-based semiconductor layers 106 and 108 for inducing a 2DHG region. By intentionally designing the thickness ratio in the afore-mentioned specific range, a 2DHG region is hardly to be automatically/inherently generated in the nitride-based semiconductor layer 108.

In some embodiments, the thickness T1 of the nitride-based semiconductor layer 106 ranges from about 35 nm to about 50 nm. In some embodiments, the thickness T2 of the nitride-based semiconductor layer 108 ranges from about 10 nm to about 69 nm. In the exemplary illustration of FIG. 1, the thickness T1 is selected to be greater than the thickness T2. The ratio of the thickness T1 to the thickness T2 is intentionally controlled/selected in a range from about 1 to about 5. In some embodiments, the material of the nitride-based semiconductor layer 106 can be $Al_aGa_{(1-a)}N$ where $0.2 \le a \le 0.54$.

In this regard, with the above design of the thickness T1 and the content of Aluminum (Al) in the nitride-based semiconductor layer 106 (e.g., $Al_aGa_{(1-a)}N$), the polarization effect of the nitride-based semiconductor layers 106 and 108 can be further suppressed. Such a design can make a 2DHG region hard to be induced/generated naturally. Moreover, with the above design of the thickness T2, the nitride-based semiconductor layer 108 is thin enough (e.g., in a range from about 10 nm to about 69 nm), such that holes are hard to be naturally generated at the heterojunction between the nitride-based semiconductor layers 106 and 108.

In the present disclosure, by introducing an external factor into the semiconductor device 100A, a 2DHG region can be generated at the heterojunction between the nitride-based semiconductor layers 106 and 108. In some embodiment, the external factor includes applying stress to the nitride-based semiconductor layer 108.

In order to externally induce/generate at least one 2DHG region, there is a need to enhance the polarization effect of the nitride-based semiconductor layers 106 and 108. The stress modulation layers 130 and 132 can be adopted into the semiconductor device 100A to alter/adjust/control the stress distribution of the nitride-based semiconductor layers 106 and 108, enhancing the polarization effect therein.

Specifically, the stress modulation layers 130 and 132 are disposed on/over/above the nitride-based semiconductor layer 108. The stress modulation layer 130 is in contact with the drift region R1 of the nitride-based semiconductor layer 108. The stress modulation layer 130 is positioned between the source electrode 120 and the gate electrode 124. The stress modulation layer 132 is in contact with the drift region R2 of the nitride-based semiconductor layer 108. The stress modulation layer 132 is positioned between the drain electrode 122 and the gate electrode 124. The stress modulation layers 130 and 132 are spaced apart from each other by the gate electrode 124.

The stress modulation layers 130 and 132 can provide/apply the drift regions R1 and R2 with stresses respectively, so as to control/adjust the stress distribution therein. In some embodiments, lattice constants of the stress modulation layers 130 and 132 can be greater than that of the nitride-based semiconductor layer 108, such that the stress modulation layers 130 and 132 can provide expansive strains or tensile stresses with the drift portions R1 and R2, respectively. The tensile stresses can contribute to the polarization effect of the nitride-based semiconductor layers 106 and 108, thereby resulting in induction of a 2DHG region 112 within the drift region R1 and a 2DHG region 114 within the drift region R2.

The gate portion GP of the nitride-based semiconductor layer 108 is free from coverage of the stress modulation layers 130 and 132, so there is no 2DHG region induced in the gate portion GP between the 2DHG regions 112 and 114. The source and drain portions SP and DP of the nitride-based semiconductor layer 108 are free from coverage of the stress modulation layers 130 and 132. Since no 2DHG region is naturally induced beneath the source, drain, and the gate portions SP, DP and GP, the hole concentrations of the 2DHG regions 112 and 114 are greater than those of the heterojunction beneath the source, gate, drain portions SP, GP and DP of the nitride-based semiconductor layer 108. In some embodiments, the holes concentrations of the heterojunction beneath the source, drain and the gate portions SP, DP and GP are zero or approach to zero.

Specifically, the source electrode 120 has two opposite edges E1, E2. The drain electrode 122 has two opposite edges E3, E4. The gate electrode 124 has two opposite edges E5, E6. The 2DHG region 112 is cut off at a position beneath an edge E1 of the source electrode 120 facing the gate electrode 124 and at a position beneath an edge E6 of the gate electrode 124 facing the source electrode 120. The hole concentration of the heterojunction at a portion beneath the edge E1 of the source electrode 120 facing the gate electrode 124 may be greater than the hole concentration of the heterojunction at a portion beneath an edge E2 of the source electrode 120. The hole concentration of the heterojunction at the portion beneath the edge E2 of the source electrode 120 could be zero. The reason is that the stress provided by the stress modulation layer 130 can be lightly transmitted into a position beneath the edge E1 of the source electrode 120. Such a configuration is advantageous to transmit carriers with the source electrode 120.

The 2DHG region 114 is cut off at a position beneath an edge E5 of the gate electrode 124 facing the drain electrode 122 and at a position beneath an edge of the drain electrode 122 facing the gate electrode 124. The hole concentration of the heterojunction at a portion beneath the edge E4 of the drain electrode 120 facing the gate electrode 124 may be greater than the hole concentration of the heterojunction at a portion beneath an edge E3 of the drain electrode 122. The hole concentration of the heterojunction at the portion beneath the edge E3 of the drain electrode 122 could be zero. The reason is that the stress provided by the stress modulation layer 132 can be lightly transmitted into a position beneath the edge E4 of the drain electrode 122. Such a configuration is advantageous to transmit carriers with the drain electrode 122.

Therefore, the boundaries of the 2DHG regions 112 and 114 are clearly defined. The 2DHG regions 112 and 114 can be view as a discontinuous 2DHG region. As such, at least by controlling the thickness ratio as afore-mentioned and the distribution of the stress modulation layers 130 and 132, the semiconductor device 100A is available to include at least one GaN-based p-channel high-hole-mobility transistor (HHMT) having an enhancement mode.

In the exemplary illustration of FIG. 1, the semiconductor device 100A is an enhancement mode device, which is in a normally-off state when the gate electrode 124 is at approximately zero bias. Specifically, since the ratio of the thickness T1 to the thickness T2 is intentionally controlled/selected in a range from about 0.5 to about 5, no 2DHG region is induced in the gate portion GP. That is, the hole concentration of the heterojunction beneath the gate portion GP is zero, so as to separate the 2DHG region 112 from the 2DHG region 114. Thus, the 2DHG regions 112 and 114 are disrupted by the gate portion GP. Due to such mechanism, the semiconductor device 100A has a normally-off characteristic. In other words, when no voltage is applied to the gate electrode 124 or a voltage applied to the gate electrode 124 is less than a threshold voltage (i.e., a minimum voltage required to form an inversion layer below the gate electrode 124), the gate portion GP below the gate electrode 124 (e.g., a portion of the heterojunction beneath the gate electrode 124) is kept blocked, and thus no current flows therethrough.

Furthermore, each of the stress modulation layers 130 and 132 has a top surface in a position lower than the source, drain, and gate electrodes 120, 122 and 124, so as to avoid the semiconductor device 100A from becoming too thick. The exemplary materials of the stress modulation layers 130 and 132 can include, for example but are not limited to, AlN, GaN, or combinations thereof. In some embodiments, the material of the stress modulation layer 130 can be the same as that of the stress modulation layer 132, so the stress modulation layers 130 and 132 can be manufactured together, thereby simplifying the manufacturing process and reducing the manufacturing costs. For example, a blanket stress modulation layer is formed to cover the source, the drain and the gate electrodes 120, 122 and 124. Then, a pattering process is performed on the blanket stress modulation layer to remove the excess portions thereof, so as to form the stress modulation layers 130 and 132.

In order to be normally-off, practically, other manners for disrupting continuity of a 2DHG region of a p-channel semiconductor device between source and drain electrodes may be used. For example, one way to achieve a normally-off p-channel semiconductor device is to form a recess structure into the AlGaN barrier layer and fill the gate electrode therein, thereby extinguishing a zone of the 2DHG region directly under the gate electrode. Accordingly, there is a need to perform a destructive step, such as an etching step, to the AlGaN layer. However, the etching step may cause unexpected sidewall/surface damages, and the recessed/corrugated surface of the AlGaN layer may result in carrier scattering, thereby reducing the carrier mobility and enhancing the on-resistance of the semiconductor device. Furthermore, the etching step is need to be precisely controlled, and thus the yield rate is hard to be promoted.

As compared with a normally-off p-channel semiconductor device with a recess structure, the semiconductor device 100A creates a discontinuous 2DHG region by placing the stress modulation layers 130 and 132 on the nitride-based semiconductor layer 108 separately in a constructive way. The 2DHG regions 112 and 114 are naturally interrupted by the gate portion GP, since the hole concentration of the heterojunction beneath the gate portion GP is to zero. There is no need to utilize a destructively step, such as an etching step, to eliminate a part of the 2DHG region for creating a discontinuous 2DEG region. Hence, the p-channel enhancement mode semiconductor device can be realized. The probability of generating unexpected surface damages can be greatly reduced due to avoiding using etching process, and thus the top surface of the nitride-based semiconductor layer 108 can be kept flat. Therefore, the source, drain and the gate electrode 120, 122 and 124 can be disposed on the flat top surface of the nitride-based semiconductor layer 108, and they can be in positions at the same height level with respect to the nitride-based semiconductor layer 108. Such a configuration would not interfere with the hole transportation in the 2DHG regions 112 and 114, and thus the hole mobility of the semiconductor device 100A can be improved. In summary, the semiconductor device 100A can have good electrical properties, a good reliability and a good yield rate.

The isolation structures 110 can be disposed on/over/ above the buffer layer 104. The isolation structures 110 can be disposed at two opposite sides of the nitride-based semiconductor layers 106 and 108, respectively. The isolation structures 110 and the nitride-based semiconductor layer 106 collectively cover a top surface of the buffer layer 104. In the embodiments of the disclosure, the isolation structures 110 can achieve the function of the electrical isolation; therefore, the isolation structure 110 can be served as a spacer. For example, another electronic device can be grown on the substrate 102 and the buffer layer 104, and the isolation structures 110 is are formed for electrical isolation to the electronic device. In some embodiments, the isolation structures 110 can be a trench, an implant region or well. In some embodiments, the exemplary materials of the isolation structures 110 can be a dielectric material. For example, the isolation structures 110 can include $SiN_x$, $SiO_x$, SiON, SiC, SiBN, SiCBN, oxides, nitrides, plasma enhanced oxide (PEOX), or combinations thereof.

The passivation layer 140 covers the source, drain and the gate electrodes 120, 122 and 124, the stress modulation layers 130 and 132, and the isolation structures 110. In some embodiments, the passivation layer 140 can serve as a planarization layer which has a level top surface to support other layers/elements. In some embodiments, the passivation layer 140 can be formed as a thicker layer, and a planarization process, such as chemical mechanical polish (CMP) process, is performed on the passivation layer 140 to remove the excess portions, thereby forming a level top surface. The material of the passivation layer 140 can include, for example but are not limited to, dielectric materials. For example, the passivation layer 140 can include $SiN_x$, $SiO_x$, SiON, SiC, SiBN, SiCBN, oxides, nitrides, plasma enhanced oxide (PEOX), or combinations thereof.

The contact vias 150 are disposed within the passivation layer 140. The contact vias 150 can penetrate the passivation layer 140. The contact vias 150 can extend longitudinally to connect to the source, drain and the gate electrodes 120, 122 and 124. The upper surfaces of the contact vias 150 are free from coverage of the passivation layer 140. The exemplary materials of the contact vias 150 can include, for example but are not limited to, conductive materials, such as metals or alloys.

The patterned conductive layer 160 is disposed on/over/ above the passivation layer 140 and the contact vias 150. The patterned conductive layer 160 is in contact with the contact vias 150. The patterned conductive layer 160 may have metal lines, pads, traces, or combinations thereof, such that the patterned conductive layer 160 can form at least one circuit. Hence, the patterned conductive layer 160 can be served as a patterned circuit layer. The patterned conductive layer 160 can connect with the source, drain and the gate electrodes 120, 122 and 124 by the contact vias 150. An external electronic device can send at least one electronic signal to the semiconductor device 100A by the patterned conductive layer 160, and vice versa. The exemplary materials of the patterned conductive layer 160 can include, for example but are not limited to, conductive materials. The patterned conductive layer 160 may include a single film or multilayered film having Ag, Al, Cu, Mo, Ni, Ti, alloys thereof, oxides thereof, nitrides thereof, or combinations thereof.

Different stages of a method for manufacturing the semiconductor device 100A are shown in FIG. 2A, FIG. 2B, FIG. 2C and FIG. 2D, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 2A:
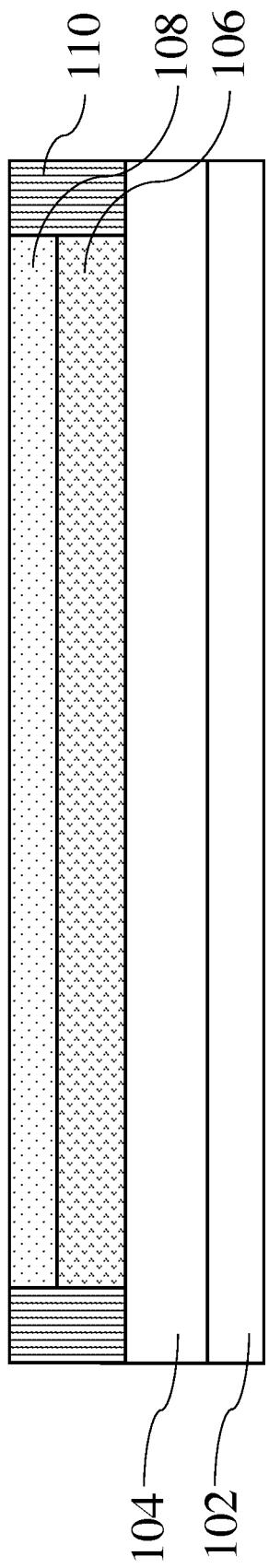
FIG. 2A, FIG. 2B, FIG. 2C and FIG. 2D show different stages of a method for manufacturing a nitride-based semiconductor device according to some embodiments of the present disclosure.

Referring to FIG. 2A, a buffer layer 104 is formed on a substrate 102 by using deposition techniques. A nitride-based semiconductor layer 106 is formed on the buffer layer 104 by using deposition techniques. A nitride-based semiconductor layer 108 can be formed on the nitride-based semiconductor layer 106 by using deposition technique, so that a heterojunction is formed therebetween.

The thickness of the nitride-based semiconductor layer 106 ranges from about 35 nm to about 50 nm. The thickness of the nitride-based semiconductor layer 108 ranges from about 10 nm to about 69 nm. It should be noted that the nitride-based semiconductor layer 108 is thin enough such that holes at heterojunction are forbidden to be free to move parallel to the heterojunction. Isolation structures 110 are formed at two opposite sides of the nitride-based semiconductor layers 106 and 108. In some embodiments, the isolation structures 110 can be formed in other stage.

Figure 2B:
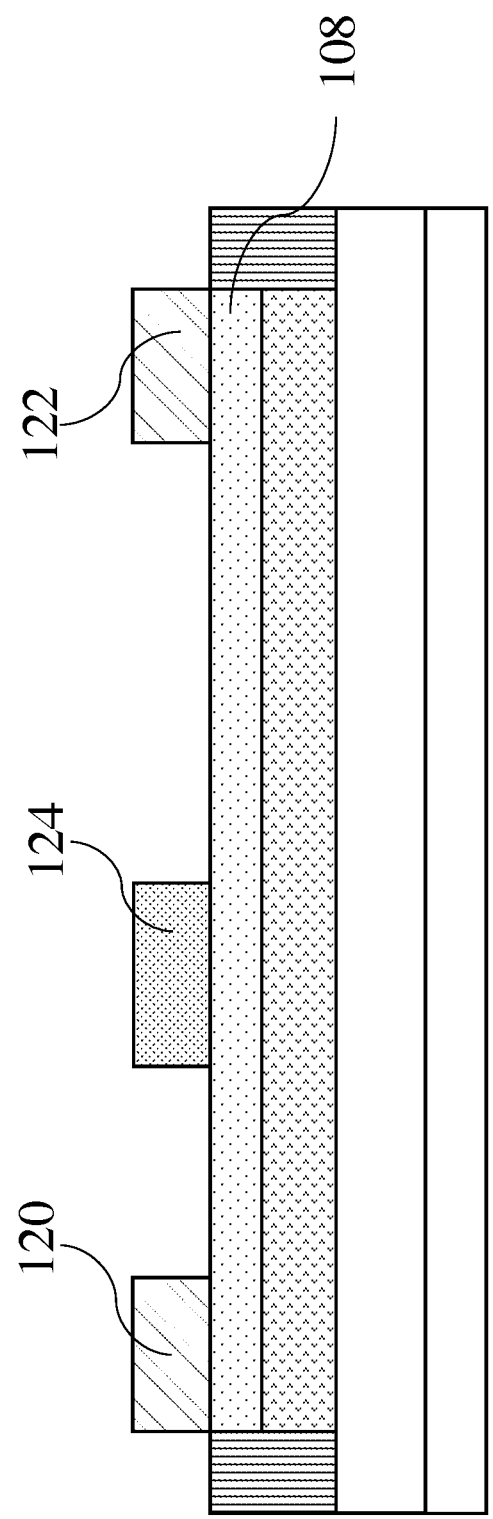

Referring to FIG. 2B, a source electrode 120, a drain electrode 122 and a gate electrode 124 are formed on/over/ above the nitride-based semiconductor layer 108. The formation of the source, drain and gate electrodes 120, 122 and 124 includes deposition techniques and a patterning process. In some embodiments, the deposition techniques can be performed for forming a blanket layer, and the patterning process can be performed for removing excess portions thereof. In some embodiments, the patterning process can include photolithography, exposure and development, etching, other suitable processes, or combinations thereof.

Figure 2C:
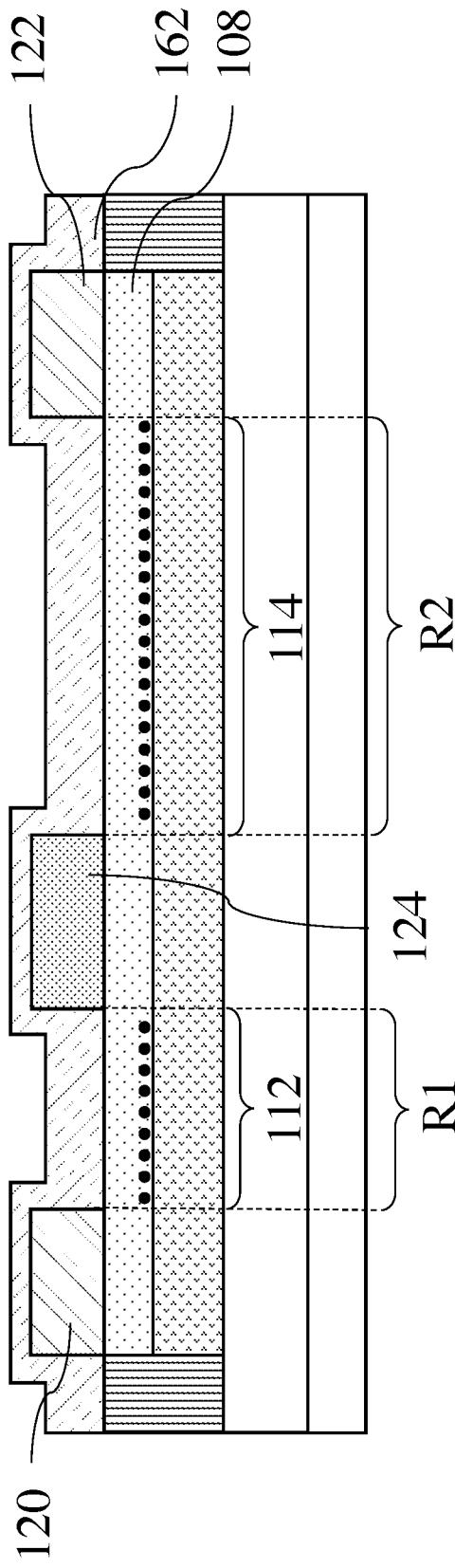

Referring to FIG. 2C, a blanket stress modulation layer 162 is formed to cover the source electrode 120, the drain electrode 122, the gate electrode 124, and the nitride-based semiconductor layer 108. The lattice constant of the blanket stress modulation layer 162 is greater than that of the nitride-based semiconductor layer 108, such that the blanket stress modulation layer 162 can provide tensile stresses with the drift portions R1 and R2 of the nitride-based semiconductor layer 108. As such, 2DHG regions 112 and 114 are induced within the drift portions R1 and R2, respectively.

Figure 2D:
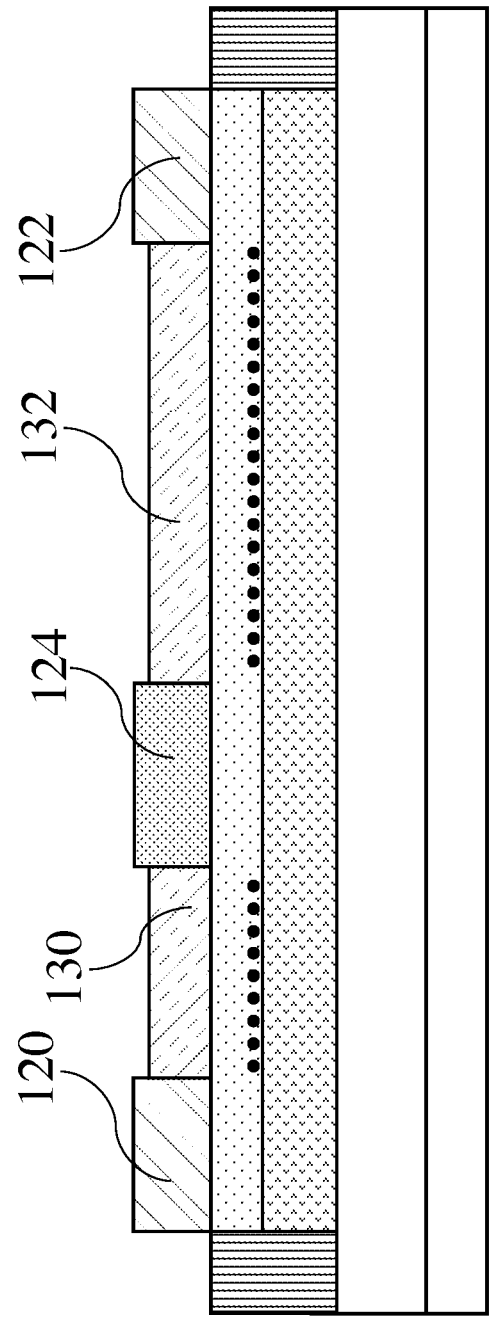

Referring to FIG. 2D, an etching process is performed on the blanket stress modulation layer 162 to remove the excess portions thereof, such that the source electrode 120, the drain electrode 122, and the gate electrode 124 can be exposed. Therefore, the stress modulation layer 130 can be formed between the source and gate electrodes 120 and 124. The stress modulation layer 132 can be formed between the gate and drain electrodes 124 and 122. Thereafter, the passivation layer 140, the contact vias 150, and the patterned conductive layer 160 can be formed, obtaining the configuration of the semiconductor device 100A as shown in FIG. 1.

In order to achieve different electrical properties for satisfy different requirements, the tensile stresses provided by the stress modulation layers 130 and 132 can be different in strengths, such that the 2DHG regions 112 and 114 can have different hole concentrations. The various embodiments are described in detail as follows.

Figure 3:
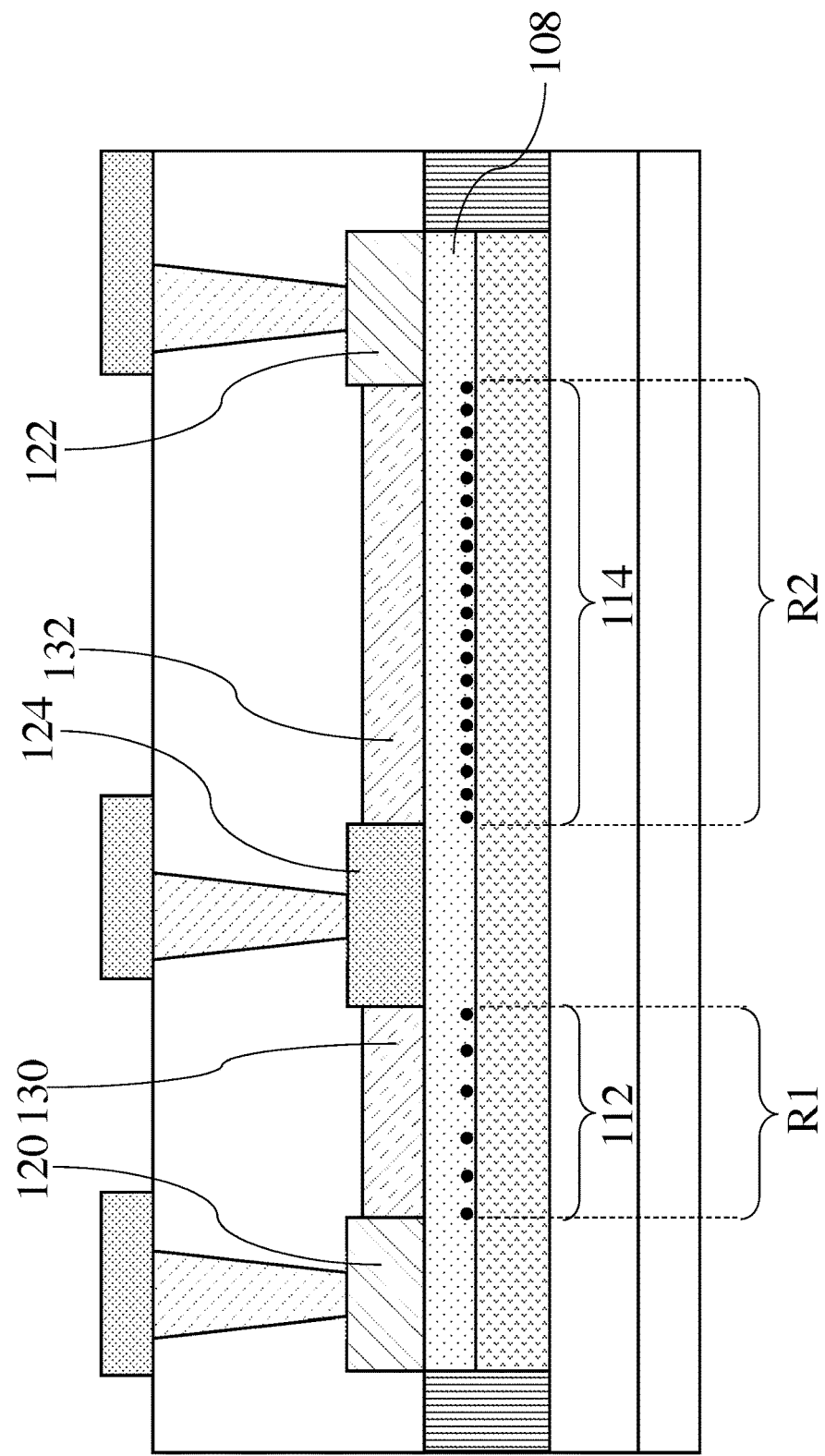
FIG. 3 is a vertical cross-sectional view of a semiconductor device according to some embodiments of the present disclosure.

FIG. 3 is a vertical cross-sectional view of a semiconductor device 100B according to some embodiments of the present disclosure. In the exemplary illustration of FIG. 3, the material of the stress modulation layer 132 can be different from that of the stress modulation layer 130. By the material difference, a lattice constant difference between the stress modulation layer 130 and the nitride-based semiconductor layer 108 is less than a lattice constant difference between the stress modulation layer 132 and the nitride-based semiconductor layer 108. For example, the material of the stress modulation layer 130 can include AlN, the material of the stress modulation layer 132 can include GaN, and the material of the nitride-based semiconductor layer 108 can include p-doped GaN. Therefore, a tensile stress provided by the stress modulation layer 130 and applied to the drift region R1 is less than a tensile stress provided by the stress modulation layer 132 and applied to the drift region R2. As such, the hole concentration of the 2DHG region 112 is less than that of the 2DHG region 114.

Figure 4:
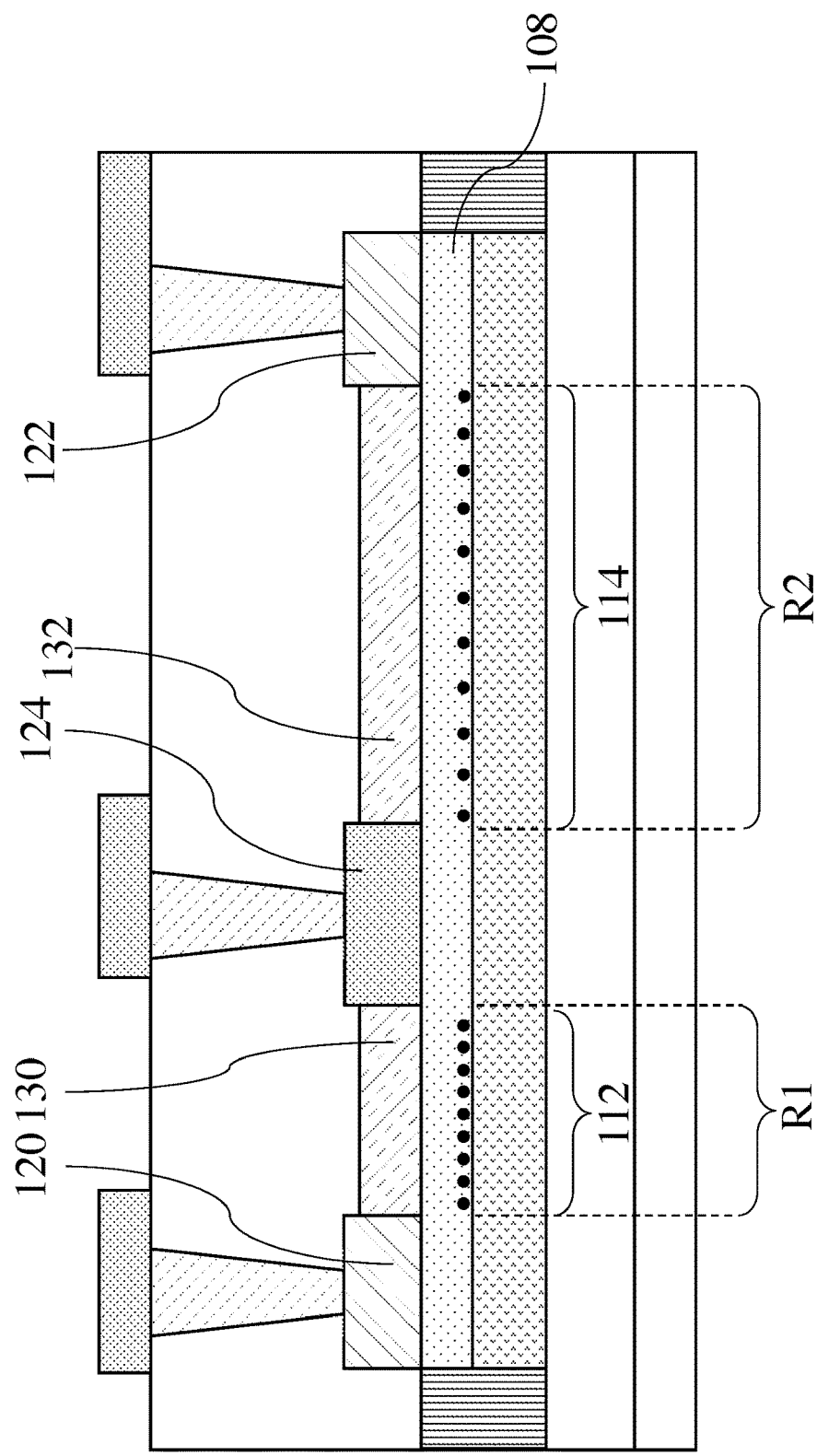
FIG. 4 is a vertical cross-sectional view of a semiconductor device according to some embodiments of the present disclosure.

FIG. 4 is a vertical cross-sectional view of a semiconductor device 100C according to some embodiments of the present disclosure. In the exemplary illustration of FIG. 4, the material of the stress modulation layer 132 can be different from that of the stress modulation layer 130. By the material difference, a lattice constant difference between the stress modulation layer 130 and the nitride-based semiconductor layer 108 is greater than a lattice constant difference between the stress modulation layer 132 and the nitride-based semiconductor layer 108. For example, the material of the stress modulation layer 130 can include GaN, the material of the stress modulation layer 132 can include AlGaN, and the material of the nitride-based semiconductor layer 108 can include p-doped GaN. Therefore, a tensile stress provided by the stress modulation layer 130 and applied to the drift region R1 is greater than a tensile stress provided by the stress modulation layer 132 and applied to the drift region R2, such that the hole concentration of the 2DHG region 112 is greater than that of the 2DHG region 114.

During the manufacturing processes of the semiconductor devices 100B and 100C, the stress modulation layers 130 and 132 can be formed by two stages in sequence, so as to deposit different materials in a region between the source electrode 120 and the gate electrode 124 and in a region between the drain electrode 122 and the gate electrode 124, respectively.

In some embodiments, the stress modulation layer 130 can include at least two different materials, such that the single drift region R1 would have different portions in contact with the different materials of the corresponding stress modulation layer. In some embodiments, the stress modulation layer 132 can include at least two different materials, such that the single drift region R2 would have different portions in contact with the different materials of the corresponding stress modulation layer. By such a configuration, the stress distribution of the nitride-based semiconductor layers 106 and 108 can be controlled more precisely, so as to achieve a better hole concentration distribution in the 2DHG region 112 or 114.

Figure 5:
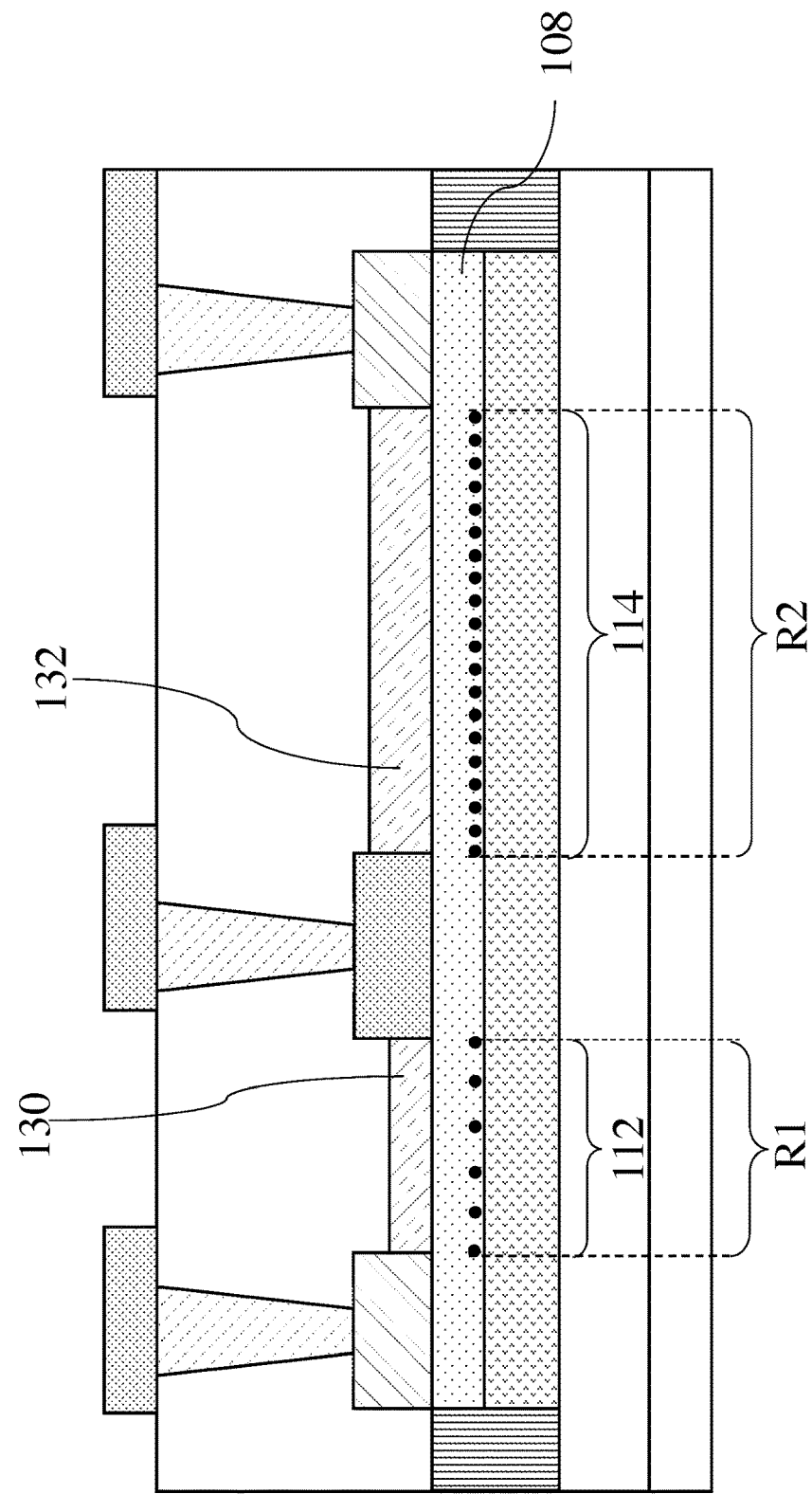
FIG. 5 is a vertical cross-sectional view of a semiconductor device according to some embodiments of the present disclosure.

FIG. 5 is a vertical cross-sectional view of a semiconductor device 100D according to some embodiments of the present disclosure. In the exemplary illustration of FIG. 5, the thickness of the stress modulation layer 130 can be less than that of the stress modulation layer 132. Hence, a tensile stress provided by the stress modulation layer 130 and applied to the drift region R1 is less than a tensile stress provided by the stress modulation layer 132 and applied to the drift region R2, such that the hole concentration of the 2DHG region 112 is less than that of the 2DHG region 114. In some embodiments, the material of the stress modulation layer 130 can be the same as that of the stress modulation layer 132.

Figure 6:
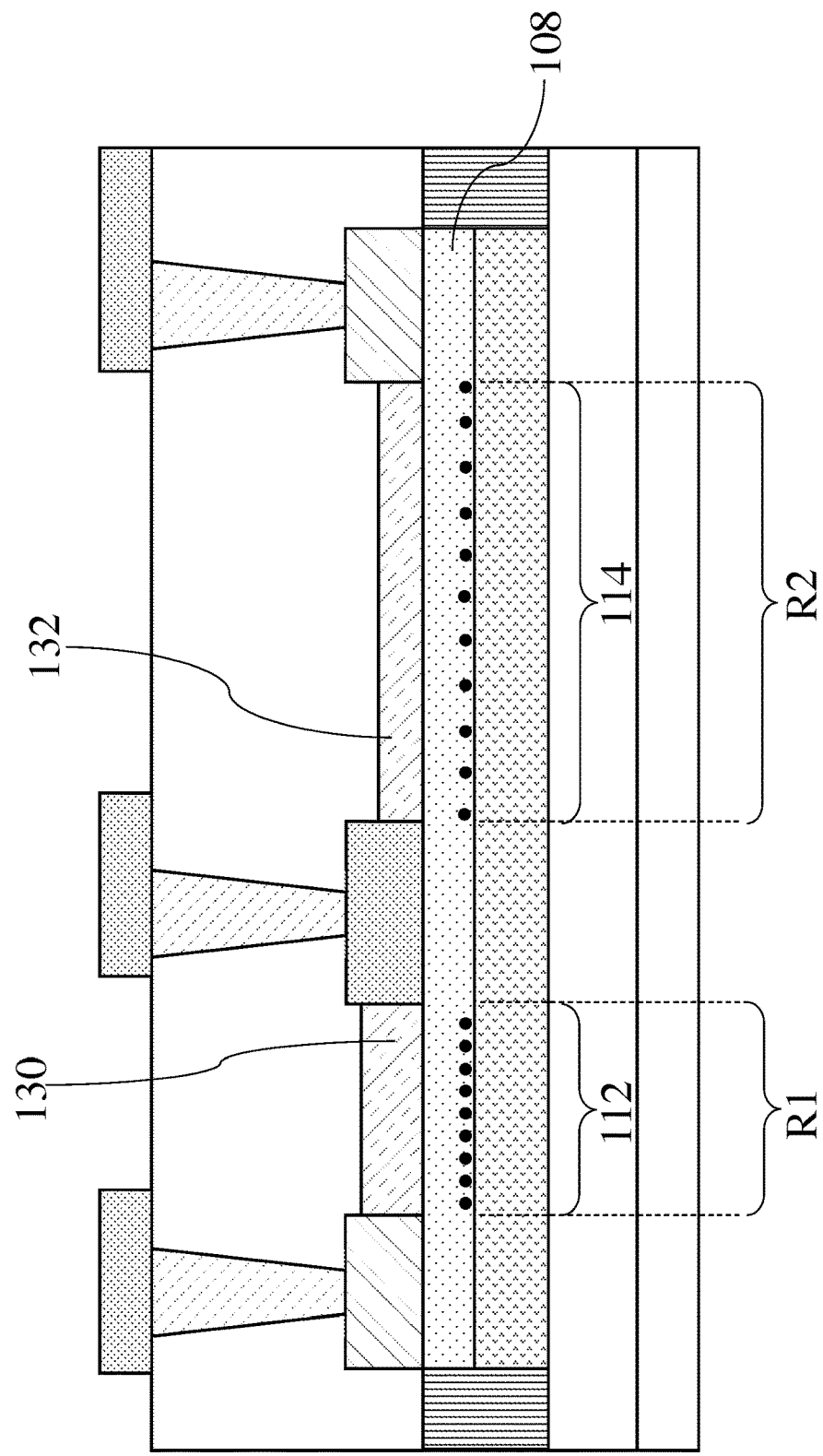
FIG. 6 is a vertical cross-sectional view of a semiconductor device according to some embodiments of the present disclosure.

FIG. 6 is a vertical cross-sectional view of a semiconductor device 100E according to some embodiments of the present disclosure. In the exemplary illustration of FIG. 6, the thickness of the stress modulation layer 130 is greater than that of the stress modulation layer 132. Hence, a tensile stress provided by the stress modulation layer 130 and applied to the drift region R1 is greater than a tensile stress provided by the stress modulation layer 132 and applied to the drift region R2, such that the hole concentration of the 2DHG region 112 is greater than that of the 2DHG region 114. In some embodiments, the material of the stress modulation layer 130 can be the same as that of the stress modulation layer 132, and During the manufacturing processes of the semiconductor devices 100D and 100E, the stress modulation layers 130 and 132 can be formed by two manufacturing stages with different deposition rates in sequence, such that the thicknesses of the stress modulation layers 130 and 132 can be different from each other.

In some embodiments, the thickness of any one of the stress modulation layers 130 and 132 can be various in order to control the stress distribution of the nitride-based semiconductor layers 106 and 108 more precisely. As such, a better hole concentration distribution in the 2DHG region 112 or 114 can be achieved.

In the semiconductor devices 100B, 100C, 100D and 100E, the materials/thicknesses of the stress modulation layers 130 and 132 can be varied, such that a tensile stress applied to the drift region R1 by the stress modulation layer 130 can differ from a tensile applied to the drift region R2 by the stress modulation layer 132. Therefore, the hole concentration within the drift region R1 can be different from that of the drift region R2. These factors can be used for making the saturation current and the on-resistance of the semiconductor devices 100B, 100C, 100D and 100E more controllable. As such, the design of the present disclosure is flexible, being available to satisfy different device requirements.

Figure 7:
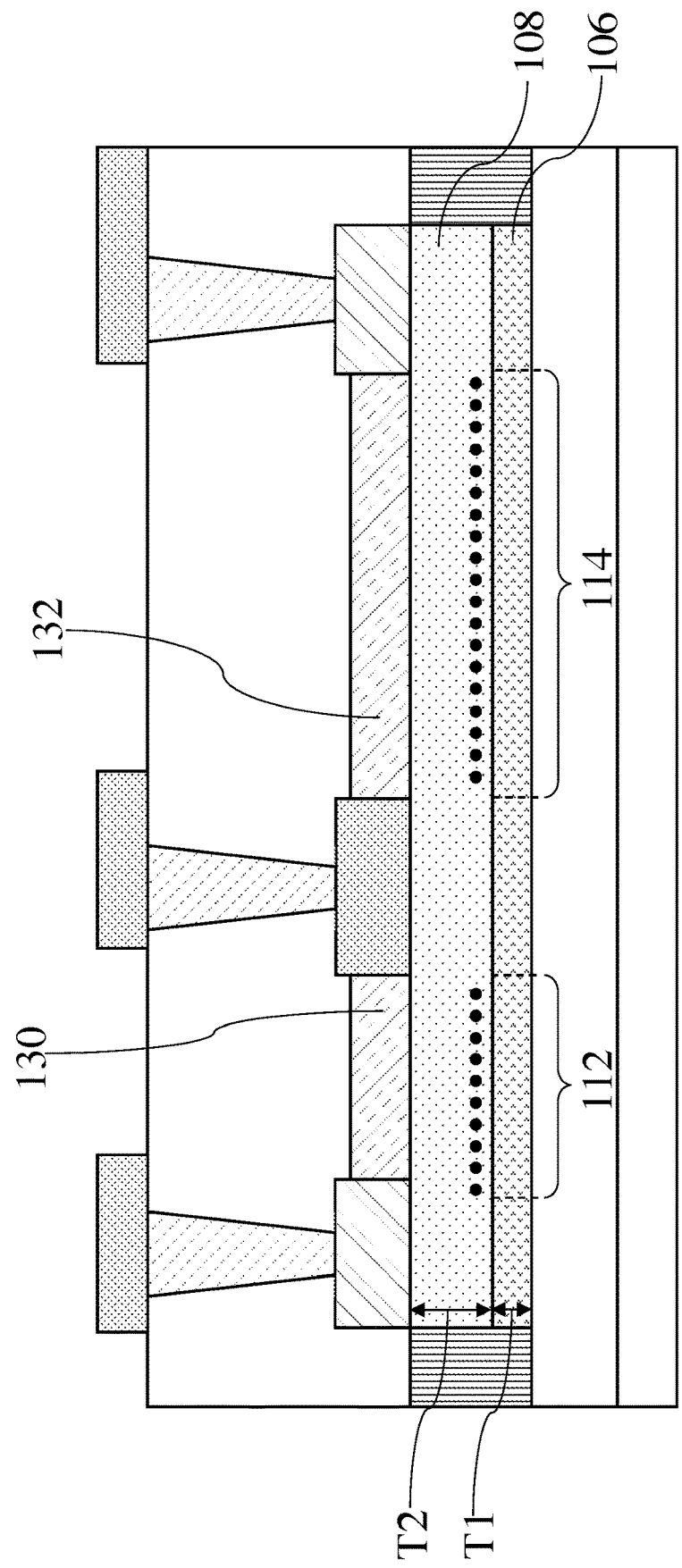
FIG. 7 is a vertical cross-sectional view of a semiconductor device according to some embodiments of the present disclosure.

FIG. 7 is a vertical cross-sectional view of a semiconductor device 100F according to some embodiments of the present disclosure. In the exemplary illustration of FIG. 7, the nitride-based semiconductor layer 108 can be thicker than the nitride-based semiconductor layer 106. The ratio of the thickness T1 to the thickness T2 is in a range from about 0.5 to about 1. That is to say, the thickness relationship between the nitride-based semiconductor layers 106 and 108 can be adjusted/altered depending on the different device requirements.

Based on the above description, in the embodiments of the present disclosure, by intentionally designing the thickness ratio of the nitride-based semiconductor layers in a range from about 0.5 to about 5, the 2DHG regions are hard to be inherently induced/generated in the nitride-based semiconductor layer having a smaller bandgap (e.g., a channel layer). Furthermore, the configuration of the separated stress modulation layers can provide different portions of the nitride-based semiconductor layer with stresses, such that the extent of polarization effect of these portions can be enhanced, thereby resulting in induction of separated 2DHG regions therein. Therefore, holes at the heterojunction of the nitride-based semiconductor layers are forbidden to be free to move parallel to the heterojunction as a voltage applied to the gate electrode is less than a threshold voltage of the gate electrode. Explained in another way, by designing the thickness ratio of the nitride-based semiconductor layers and the configuration of the separated stress modulation layers, and thus a discontinuous 2DHG region is created in the channel layer. Hence, the p-channel enhancement mode semiconductor device can be realized. The manufacturing process of the semiconductor device is simple and avoids using additional etching step to etch the nitride-based semiconductor layer. Thus, the semiconductor device of the present disclosure can have a good reliability, good electrical properties, and a good yield rate.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device comprising:
  a first nitride-based semiconductor layer having a first thickness;
  a second nitride-based semiconductor layer disposed on the first nitride-based semiconductor layer and having a bandgap less than a bandgap of the first nitride-based semiconductor layer to form a heterojunction therebetween, wherein the second nitride-based semiconductor layer has a second thickness, and a ratio of the first thickness to the second thickness is in a range from about 0.5 to about 5;
  a source electrode and a drain electrode disposed over a source portion and a drain portion of the second nitride-based semiconductor layer, respectively;
  a gate electrode disposed over a gate portion of the second nitride-based semiconductor layer and between the source and drain electrodes, so as to define a first drift region between the source and gate portions and a second drift region between the gate and drain portions;
  a first stress modulation layer disposed on the second nitride-based semiconductor layer and between the source and gate electrodes and providing the first drift region with a stress, resulting in induction of a first two-dimensional hole gas (2DHG) region within the first drift region; and
  a second stress modulation layer disposed on the second nitride-based semiconductor layer and between the gate and drain electrodes and providing the second drift region with a stress, resulting in induction of a second 2DHG region within the second drift region, wherein the ratio of the first thickness to the second thickness is selected such that hole concentrations of the first and second 2DHG regions are greater than those of the heterojunction beneath the source, gate, drain portions of the second nitride-based semiconductor layer.

2. The semiconductor device of claim 1, wherein the first and second stress modulation layers provide the first and second drift regions with tensile stresses, respectively.

3. The semiconductor device of claim 2, wherein the tensile stresses provided by first and second stress modulation layers are in different strengths such that the first and second 2DHG region have different hole concentrations.

4. The semiconductor device of claim 1, wherein the hole concentrations of the heterojunction beneath the source, gate, drain portions of the second nitride-based semiconductor layer approach to zero.

5. The semiconductor device of claim 1, wherein the gate electrode forms an interface with the second nitride-based semiconductor layer, and the hole concentration of the heterojunction beneath the gate portion is zero so as to separate the first 2DHG region from the second 2DHG region.

6. The semiconductor device of claim 1, wherein each of the first and second stress modulation layers comprises AlN, GaN, or combinations thereof.

7. The semiconductor device of claim 1, wherein the second nitride-based semiconductor layer comprises $Al_aGa_{1-a}N$, wherein $0.2 \le a \le 0.54$.

8. The semiconductor device of claim 1, wherein the first thickness of the first nitride-based semiconductor layer ranges from about 35 nm to about 50 nm.

9. The semiconductor device of claim 1, wherein the first thickness is greater than the second thickness.

10. The semiconductor device of claim 1, wherein the second thickness of the second nitride-based semiconductor layer ranges from about 10 nm to about 69 nm.

11. The semiconductor device of claim 1, wherein each of the first and second stress modulation layers has a top surface in a position lower than the source, gate, and drain electrodes.

12. The semiconductor device of claim 1, wherein the first 2DHG region is cut off at a position beneath an edge of the source electrode facing the gate electrode and at a position beneath an edge of the gate electrode facing the source electrode.

13. The semiconductor device of claim 1, wherein the second 2DHG region is cut off at a position beneath an edge of the gate electrode facing the drain electrode and at a position beneath an edge of the drain electrode facing the gate electrode.

14. The semiconductor device of claim 1, wherein the hole concentration of the heterojunction at a portion beneath a first edge of the source electrode facing the gate electrode is greater than the hole concentration of the heterojunction at a portion beneath a second edge of the source electrode opposite the first edge.

15. The semiconductor device of claim 14, wherein the hole concentration of the heterojunction at the portion beneath the second edge of the source electrode is zero.

* * * * *